United States Patent

Cottingham et al.

[11] Patent Number: 5,159,751
[45] Date of Patent: Nov. 3, 1992

[54] METHOD OF MANUFACTURING ELECTRONIC MODULE ASSEMBLY

[75] Inventors: David J. Cottingham, Palatine; Michael J. Petrites, Elk Grove Village; Thomas J. Tischhauser, Hawthorn Woods, all of Ill.

[73] Assignee: Motorola, Inc., Schaumburg, Ill.

[21] Appl. No.: 835,817

[22] Filed: Feb. 18, 1992

Related U.S. Application Data

[62] Division of Ser. No. 474,873, Feb. 5, 1990, Pat. No. 5,103,375.

[51] Int. Cl.⁵ .............................................. H05K 3/30
[52] U.S. Cl. ........................................ 29/832; 29/835; 439/67; 439/72; 439/492
[58] Field of Search ................. 29/827, 832, 848, 837, 29/852, 835; 174/254; 439/67, 77, 492

[56] References Cited

U.S. PATENT DOCUMENTS

| | | | |
|---|---|---|---|
| 3,069,753 | 12/1962 | Lalmond et al. | 439/492 X |
| 3,971,127 | 7/1976 | Giguere et al. | 29/852 X |
| 4,811,165 | 3/1989 | Currier et al. | 439/77 X |
| 4,911,643 | 3/1990 | Perry et al. | 439/67 |
| 5,007,842 | 4/1991 | Deak et al. | 439/77 X |
| 5,026,291 | 6/1991 | David | 439/77 X |
| 5,044,980 | 9/1991 | Krumme et al. | 439/67 X |

FOREIGN PATENT DOCUMENTS

| | | | |
|---|---|---|---|
| 590687 | 1/1960 | Canada | 29/837 |
| 2-239695 | 9/1990 | Japan | 29/835 |

*Primary Examiner*—Carl J. Arbes
*Attorney, Agent, or Firm*—Phillip H. Melamed

[57] ABSTRACT

An electronic module assembly (31) is provided by assembling components (17) to a planar polyimide flex circuit film (14) laminated to an aluminum rigidizer plate (11). The flex circuit film and rigidizer are then bent by a sheet metal bending process such that the rigidizer plate forms an exterior protective housing and the components are provided in an interior space (30). Connector pins (23) provide external electrical access to the components and circuit patterns (15, 16, 19) on the film (14). Structures (24, 25, 29) mate with the bent plate and substantially enclose the interior space. Module cost is reduced since the existing flex circuit rigidizer plate is used to form part of the module housing, and economical planar component assembly techniques are utilized while eliminating the step of mounting the flex circuit rigidizer plate to an external module housing. Two techniques for using a mandrel shaft (26, 35) to bend the plate (11) without stressing the film (14) are disclosed.

3 Claims, 1 Drawing Sheet

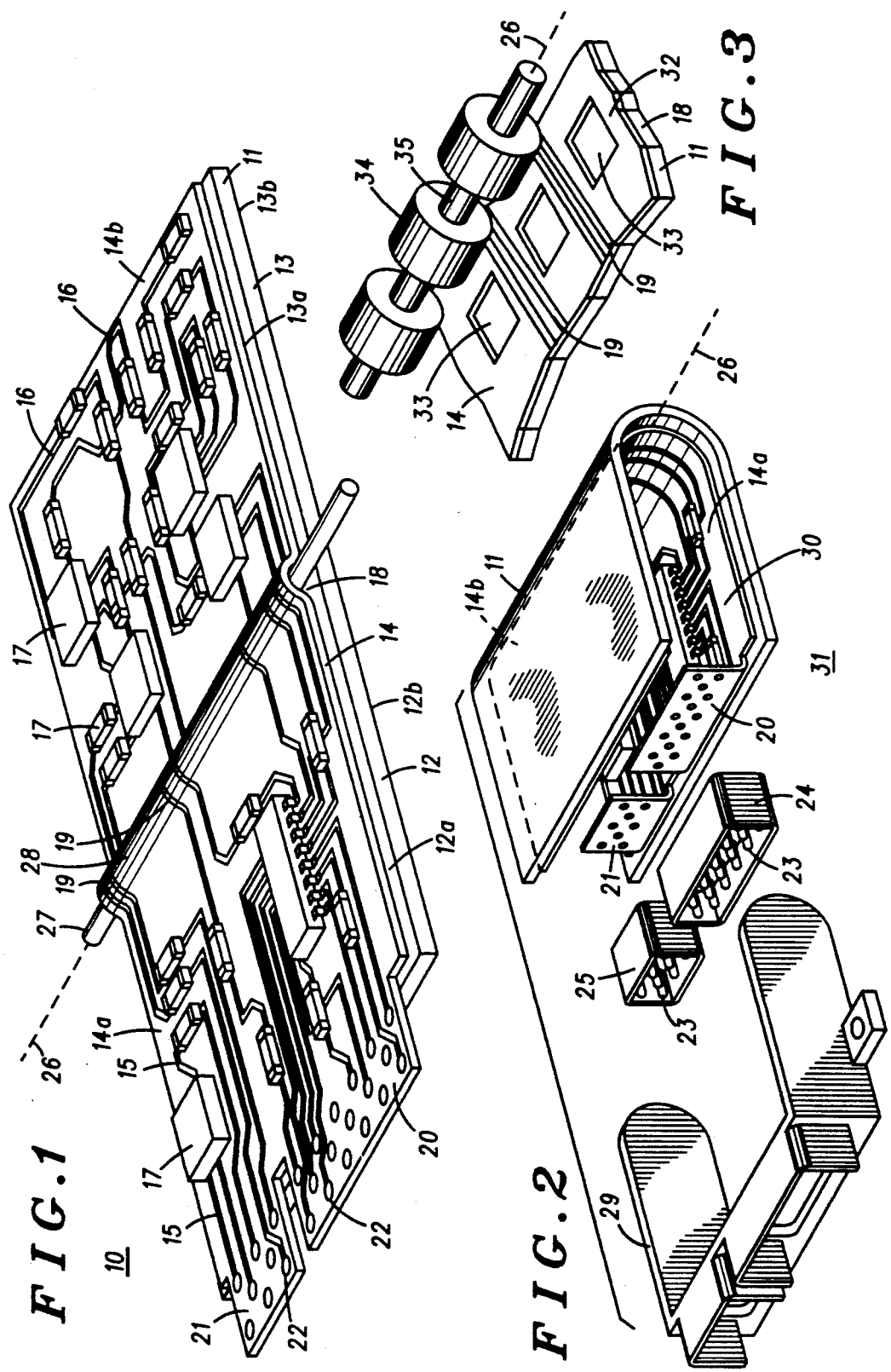

METHOD OF MANUFACTURING ELECTRONIC MODULE ASSEMBLY

This is a division of application Ser. No. 07/474,873, filed Feb. 5, 1990, priority under which is hereby claimed.

BACKGROUND OF THE INVENTION

1. Field of the Invention

The present invention relates to electronic module assemblies and their method of manufacture. More particularly, the present invention is directed to providing an electronic module having an external housing for protecting components located within the module housing.

2. Description of the Prior Art

Prior electronic module assemblies are known in which a polyimide flex circuit undergoes Planar assembly in which a plurality of components are mounted on conductive circuit patterns on a polyimide film. A plurality of rigidizers plates are provided under various portions of the flex circuit film, and after component assembly the rigidizer plates are oriented so they are non-coplanar. Then the rigidizer plates are mounted to an external protective housing for the module. This prior art module assembly and method requires the additional manufacturing step of mounting the rigidizer plates to the external protective housing. This mounting step may degrade the thermal conduction between the rigidizer plate and the external housing wherein this thermal conduction may be relied upon for providing heat sinking for the components in the assembly which are mounted on the flex circuit film. Also, the providing of the external housing typically represents a significant cost of the module.

OBJECTS OF THE INVENTION

An object of the present invention is to provide an improved electronic module assembly and a method for manufacturing such an improved electronic module assembly wherein the cost, manufacturing and performance problems noted above are minimized.

A more particular object of the present invention is to provide an improved electronic module assembly and method in which less additional external housing structure for the module assembly is required due to the utilization of the flex circuit rigidizer plates as at least part of the external module housing.

An additional object of the present invention is to provide an improved manufacturing method for an electronic module assembly in which a flex circuit rigidizer plate can be selectively bent into a desired shape without damaging or providing excessive stress to the flex circuit.

BRIEF DESCRIPTION OF THE DRAWINGS

The present invention can be better understood by reference to the drawings in which:

FIG. 1 is a perspective view of a planar flex circuit subassembly constructed in accordance with the present invention;

FIG. 2 is an exploded perspective view of an electronic module assembly which utilizes the flex circuit subassembly shown in FIG. 1 after that assembly is bent into a desired shape;

FIG. 3 is a partial perspective view of a flex circuit subassembly similar to that shown in FIG. 1 for which an alternative bending step is contemplated.

DESCRIPTION OF THE PREFERRED EMBODIMENTS

Referring to FIG. 1, a planar flex circuit subassembly 10 is illustrated prior to a bending operation. The subassembly 10 comprises a rigid thermally conductive planar aluminum base plate 11 having integral first and second portions 12 and 13 each having its own planar top and bottom surfaces 12a, 12b, 13a and 13b, respectively. A preformed sheet of polyimide insulating film 14 is bonded to the first and second base portion top surfaces 12a and 13a. Preferably, prior to any bending of the base 11, first and second electrically conductive circuit patterns (traces/metalizations) 15 and 16 are provided on portions 14a and 14b of the polyimide film which are bonded to the top surfaces 12a and 13a, respectively. A plurality of discrete electrical components 17 are provide on and connected to each of the first and second circuitry patterns 15 and 16.

The aluminum rigidizer base plate 11 has an integral intermediate portion 18 between the first and second portions 12 and 13, and circuit paths (metalizations) 19 on the flex circuit film 14 interconnect the first and second circuitry patterns 15 and 16 and the components 17 located on each of the top surfaces 12a and 13a. The flex circuit film 14 has a pair of nonbonded and nonsupported integral extending portions 20 and 21 each having a plurality of holes 22 therein adjacent conductive metalizations. These holes are intended for subsequent mating connection to electrical contact pins 23 of a pair external electrical connectors 24 and 25 shown in FIG. 2. These connections are to be made by conventional soldering techniques, as are the connections between the components 17 and the conductive circuit patterns 15 and 16. The components 17 are soldered to the circuit patterns 15 and 16 by reflow solder techniques while the surfaces 12a, 13a, 14a, and 14b are essentially coplanar. Each of the connectors 24 and 25 has its own associated rigid plastic housing. If possible only a signal connector might be usable.

The structure which has so far been described above is conventional. However, due to final packaging form requirements it may sometimes be desired to have the rigidizer plate portions 12 and 13 oriented in a final non-coplanar configuration. In such a case, previously these rigidizer portions would typically be provided as separate nonintegral plates or planar integral plates connected by removeable or breakable runners to facilitate reorienting the plates in a subsequent non-coplanar configuration. These plates would then also be mechanically, and possibly thermally, bonded to an external module housing which would provide mechanical protection for the components 17. However, the present invention contemplates an alternative structure and describes manufacturing methods to achieve this alternative structure.

Referring to FIG. 1, an axis 26 is illustrated about which the integral rigidizer plate 11 will be bent by a sheet metal bending process after the components 17 have been soldered to the conductive circuit patterns 15 and 16. The axis 26 is shown in FIG. 1 to be substantially coincidence with the axis of a mandrel shaft 27 positioned on the top surface of the plate 11 and beneath a nonbonded loop portion 28 of the flex film 14. The interconnecting circuit paths 19 are provided on this loop portion 28 which is oriented generally along the axis 26. It is contemplated that the mandrel shaft 27 is utilized during the bending of the rigidizer plate 11 into a final desired C shape configuration as shown in FIG. 2. The nonbonded loop portion 28 of the flex film 14 provides an intermediate integral film portion that connects film portions 14a and 14b on which the conductive circuit patterns 15 and 16 are provided on, respectively. Prior to or after the desired bending step, the electrical pins 23 of the connectors 24 and 25 are joined to the circuit patterns adjacent the through holes 22 in the extending flex tabs 20 and 21. After the bending step an additional module enclosure assembly portion 29, which may comprise a plastic molded component, is mated to and joined to the bent rigidizer base plate 11 and the connectors 24 and 25. This substantially encloses an interior space 30 effectively bounded by the top surfaces 12a and 13a of the bent rigidizer plate, the connectors 24 and 25 and the enclosure portion 29. Note that some details of the components 17 and metalizations within the space 30 are not shown in FIG. 2

After the bending operation, the first and second rigidizer plate top surfaces 12a and 13a are non-coplanar and the bottom surfaces 12b and 13b now form the external surface of a protective housing for the components 17 which are located in the interior space 30. The connectors 24 and 25 and the enclosing portion 29 form the rest of the protective housing for the components 17. Assembly of the module components shown in FIG. 2 results in an electronic module assembly 31 which requires no additional external protective housing since the bent rigidizer plate 11, the enclosing portion 29 and the electrical connectors 24 and 25 provide the desired protective housing. The connectors provide external electrical access to the components 17. In addition, there is no required thermal connection of the rigidizer plate 11 to an external housing for heat sinking unless additional heat sinking capacity, in addition to than that provided by the rigidizer plate 11, is required. The plate 11 already provides some heat sinking since it has a significant thermal mass.

Preferably, the electronic module assembly 31 can be implemented while providing a hermetic seal for the interior space 30. The plastic enclosing portion 29 could have plastic posts which were ultrasonically deformed over the rigidizer plate 11 to provide the desired final assembly. Alternatively, epoxy or some other adhesive could be utilized to form a hermetic seal and/or bond the enclosing portion 29 and connectors 24 and 25 to the bent rigidizer plate 11.

The providing of the loop portion 28 of the flex circuit is significant in that it permits minimizing stress applied to the flex circuit adjacent the bending axis 26 during the bending operation. The presence of loop 28 takes up stress which might be applied to the interconnects 19 during any bending of the base 11 and also allows the mandrel shaft to directly contact the base 11 during bending without applying pressure through the film 14 which might rupture or scratch the interconnects 19. Such a feature is useable whenever it is desired to bond a flex circuit portion to a planar rigidizer plate, planarly assemble components thereon, preferably by conventional reflow soldering techniques, and then subsequently bend the rigidizer plate into a desired shape. This technique is particularly useful when the flex circuit comprises a preformed sheet of insulating material, such as film 14, having conductive metalization patterns thereon prior to the bending of the rigidizer plate.

FIG. 3 illustrates an alternate technique for accomplishing a desired bending of the rigidizer plate 11. In FIG. 3, only a central portion of the rigidizer plate 11 and the flex circuit film 14 bonded thereto is illustrated. In FIG. 3, a central portion 32 of the flex circuit film 14 is provided on intermediate portion 18 with a plurality of openings 33 therein generally along the bend axis 26. The openings 33 mate with a plurality of raised portions 34 of a mandrel 35 shown in FIG. 3. The interconnecting circuit paths 19 are provided on the central film portion 32 between the openings 33. During the bending process as contemplated by the structure shown in FIG. 3, the raised portions 34 of the mandrel 35 will directly contact the top surface of the rigidizer plate 11 through the openings 33, but portions of the mandrel between the raised portions 34 will not contact or press against the interconnecting circuit paths 19 during the bending process. This prevents the mandrel from scratching or otherwise disrupting the circuit patterns 19 or the film 14 during the bending process while still allowing the mandrel to provide force against the rigidizer plate 11 during the bending process. This technique could be used if the film 14 were first deposited on the base 11, the metalizations 15, 16 and 19 were then applied to the film, and then the base 11 were bent.

FIG. 3 shows how to use a mandrel having raised portions 34 in conjunction with holes 33 in the film 14. However, it is also possible to obtain suitable results without providing the holes 33, as long as the interconnections 19 are positioned, as shown in FIG. 3, between the raised portions 34 during the bending process.

While we have shown and described specific embodiments of the present invention, further modifications and improvements will occur to those skilled in the art. All such modifications which retain the basic underlying principles disclosed and claimed herein are within the scope of this invention.

We claim:

1. A method for manufacturing an electronic module assembly comprising the steps of:

providing a rigid thermally conductive base having integral at least first and second portions each of which having a planar top surface and a bottom surface, said first and second base portion top surfaces being initially substantially coplanar;

providing first and second electrically conductive circuitry patterns, respectively, on different planar portions of a common integral insulating film, each of said different planar portions of said film provided on each of said first and second base portion top surfaces, respectively;

providing a plurality of discrete electrical components on and connected to each of said first and second circuitry patterns while said first and second base portions are substantially coplanar;

bending said base along at least one axis after providing said components on said circuitry patterns such that said first and second base portion top surfaces are non-coplanar and said bottom surfaces of said first and second base portions form the external surface of a protective housing for said components which are located in an interior space bounded by at least said first and second base portion top surfaces;

wherein said insulating film is also provided with conductive circuit paths thereon interconnecting said first and second circuitry patterns, and wherein said bending step includes providing a mandrel having an axis substantially coincident with the axis about which said base is bent during said bending step, and wherein said mandrel has a plurality of raised portions along its axis which mate with and contact corresponding portions of said base during said bending step through openings provided in said insulating film, said film having said interconnecting conductive circuit paths connecting said first and second circuitry patterns between said openings.

2. A method for manufacturing an electronic module assembly comprising the steps of:

providing a rigid thermally conductive base having integral at least first and second portions each of which having a planar top surface and a bottom surface, said first and second base portion top surfaces being initially substantially coplanar;

providing first and second electrically conductive circuitry patterns, respectively, on different planar portions of a common integral insulating film, each of said different planar portions of said film provided on each of said first and second base portion top surfaces, respectively;

providing a plurality of discrete electrical components on and connected to each of said first and second circuitry patterns while said first and second base portions are substantially coplanar;

bending said base along at least one axis after providing said components on said circuitry patterns such that said first and second base portion top surfaces are non-coplanar and said bottom surfaces of said first and second base portions form the external surface of a protective housing for said components which are located in an interior space bounded by at least said first and second base portion top surfaces;

wherein said insulating film is also provided with conductive circuit paths thereon interconnecting said first and second circuitry patterns, and wherein said bending step includes providing a mandrel having an axis substantially coincident with the axis about which said base is bent during said bending step, and wherein said mandrel has a plurality of raised portions along its axis which mate with and provide force against corresponding portions of said base during said bending step, said film having said interconnecting conductive circuit paths connecting said first and second circuitry patterns between said raised portions of said mandrel during said bending step.

3. A method for manufacturing an electronic module assembly comprising the steps of:

providing a rigid thermally conductive base having integral at least first and second portions each of which having a planar top surface and a bottom surface, said first and second base portion top surfaces being initially substantially coplanar;

providing first and second electrically conductive circuitry patterns, respectively, on different planar portions of a common integral insulating film, each of said different planar portions of said film provided on each of said first and second base portion top surfaces, respectively;

providing a plurality of discrete electrical components on and connected to each of said first and second circuitry patterns while said first and second base portions are substantially coplanar;

bending said base along at least one axis after providing said components on said circuitry patterns such that said first and second base portion top surfaces are non-coplanar and said bottom surfaces of said first and second base portions form the external surface of a protective housing for said components which are located in an interior space bounded by at least said first and second base portion top surfaces;

wherein said insulating film is also provided with conductive circuit paths thereon interconnecting said first and second circuitry patterns, and wherein said bending step includes providing a mandrel having an axis substantially coincident with the axis about which said base is bent during said bending step, wherein said film is a preformed sheet of film, carrying metalizations which form said circuitry patterns and circuit paths, which is then bonded to said base, and wherein said film, after being bonded to said base, has a nonbonded loop portion located between said first and second base portions and located generally along said axis, said mandrel being positioned between said nonbonded loop film portion and said base during said bending step, said nonbonded loop portion of said film carrying thereon said conductive circuit paths interconnecting said first and second circuitry patterns.

* * * * *